May 29, 1951 L. E. NORTON 2,555,150

GENERATION OF MICROWAVE OSCILLATIONS OF STABLE FREQUENCY AT HIGH POWER LEVELS

Filed Oct. 1, 1949 2 Sheets-Sheet 1

INVENTOR
Lowell E. Norton
BY
J. L. Whittaker
ATTORNEY

INVENTOR
Lowell E. Norton
BY
J. L. Whittaker
ATTORNEY

Patented May 29, 1951

2,555,150

UNITED STATES PATENT OFFICE 2,555,150

GENERATION OF MICROWAVE OSCILLATIONS OF STABLE FREQUENCY AT HIGH-POWER LEVELS

Lowell E. Norton, Princeton, N. J., assignor to Radio Corporation of America, a corporation of Delaware Application October 1, 1949, Serial No. 119,119

12 Claims. (Cl. 250—36)

This invention relates to methods and systems for providing, at high power level, microwave oscillations of rigidly controlled frequency and particularly concerns stabilization of the frequency of magnetrons and other high-power microwave oscillators.

At present, microwave amplifiers affording substantial power amplification are non-existent and accordingly it is not practicable to produce high-power microwave energy by amplification of the power output of a low-level microwave oscillator which is frequency-stabilized as by arrangements shown in my copending application Serial No. 5,603 filed January 31, 1948. Moreover, stabilization of the frequency of high-power microwave oscillators by methods and arrangements which depend upon phase control of microwave feedback energy are in general unsatisfactory because, inter alia, precise frequency control requires high-Q circuit elements for the oscillator system whereas large power output at high efficiencies imposes operating conditions inconsistent with that essential requirement.

In accordance with the present invention, the frequency of a low-power, lightly-loaded microwave oscillator is stabilized by a high-Q element, preferably a confined body of gas exhibiting molecular resonance at the desired operating frequency of a high-power microwave oscillator. The output frequencies of the two oscillators are beat against or mixed with the frequency of a third oscillator, which need not be stabilized and may be of low-power type, so to produce two, relatively low, beat frequencies whose deviation from a predetermined phase relation corresponds with deviations of the high-power oscillator from its desired operating frequency. When either of the oscillators is to be modulated, the operating frequency of the third oscillator is preferably so chosen that the resulting beat frequencies are substantially outside the range of the modulation frequencies.

Figure 1:
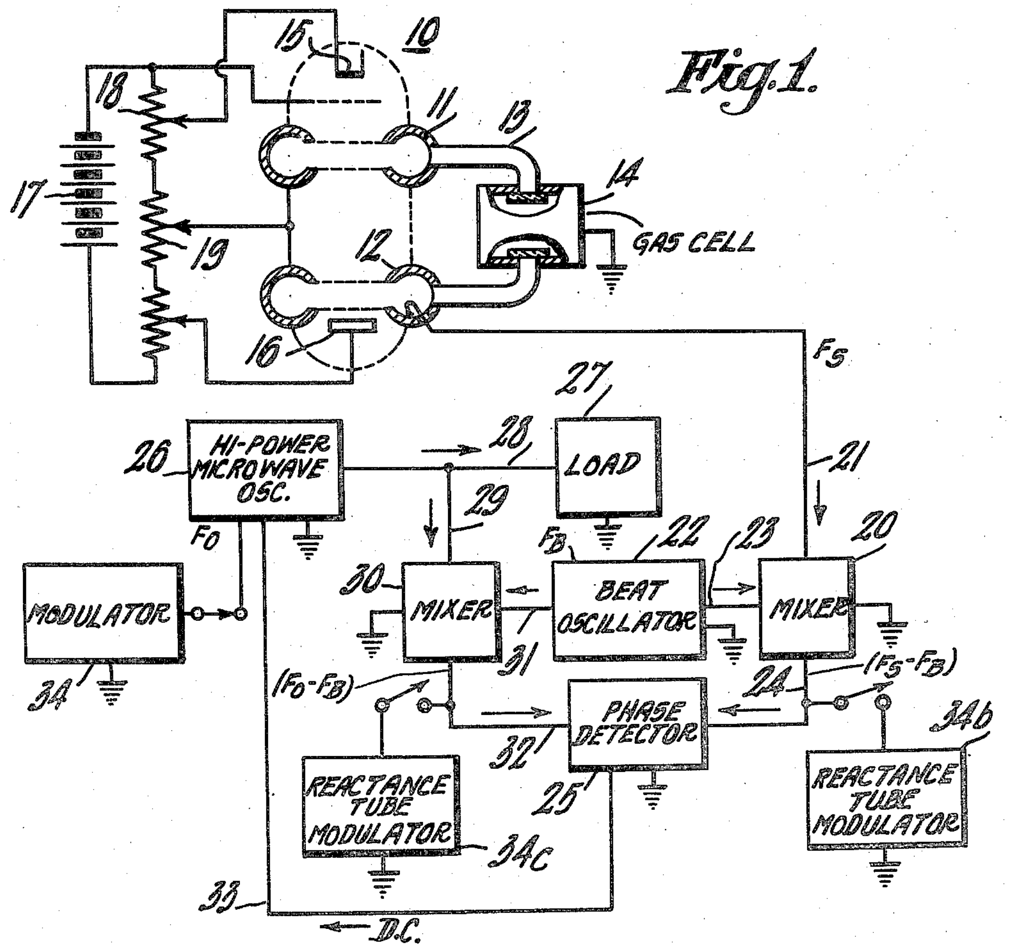
Figure 2:
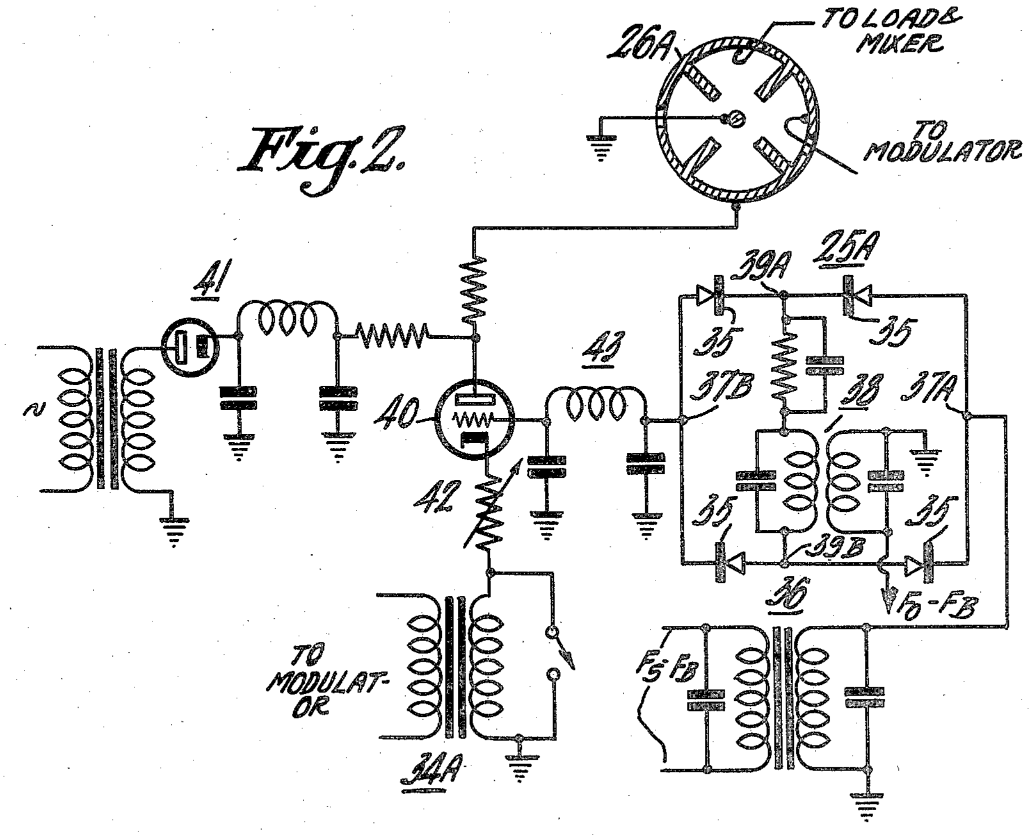
Figure 3:
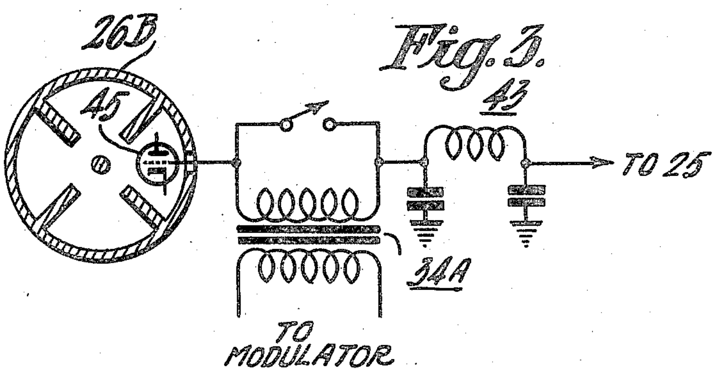

For a more detailed understanding of the invention, reference is made to the accompanying drawings in which:

Figure 1 is a block diagram of an oscillator system embodying the invention;

Figure 2 schematically illustrates a specific form of the system of Figure 1;

Figure 3 in part illustrates another modification of Figure 1; and

Figure 4:
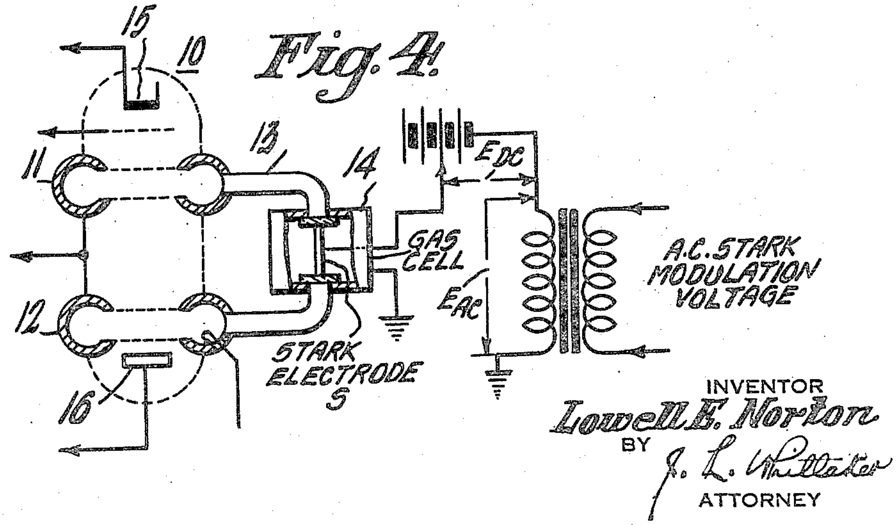

Figure 4 is a fragmentary schematic circuit diagram of a modification of the circuit of Figure 1.

In the arrangement shown in Figure 1, the low-power microwave oscillator 10 is a Klystron having cavities 11 and 12 in succession traversed by a beam of electrons and coupled by a feedback loop 13. The frequency of the generated microwave oscillations is at least roughly determined by the dimensions of the cavities and the operating potentials of the electrodes. For precise control of the frequency of the generated oscillations, the feedback path 13 includes a sharply resonant circuit device 14 whose Q is high compared to the Q's of the cavities 11 and 12. Preferably, the sharply resonant circuit element 14 is a sealed chamber containing a gas which exhibits molecular resonance at the desired operating frequency of the oscillator. This gas may be ammonia or any of the other gases mentioned in copending applications including Serial Nos. 25,542 filed May 7, 1948, and 5,603 filed January 31, 1948. The gas is confined within the chamber 14 by windows of mica or other material transparent to the microwave energy and is at low pressure, for example 0.02 millimeter of mercury or less so that the reactance of the gas transmission element rapidly changes in sign upon deviation of the oscillator frequency from the molecular resonant frequency of the gas, all as more fully discussed in aforesaid copending application Serial No. 5,603 filed January 31, 1948.

As the only load which need be imposed upon the oscillator is that of a mixer, later described, the beam current traversing the cavities in its flow between the cathode 15 and collector anode 16 is very low and consequently the loading or damping effect of the beam current is negligible. The frequency of the oscillations generated by the oscillator 10 is therefore extremely stable at all times and very precisely corresponds with the resonant frequency of the gas-filled cavity, waveguide, or similar high-Q circuit element 14. The microwave power requirements of the oscillator 10 may be of the order of milliwatts in contrast with the load requirements of oscillator 26 which may be of the order of kilowatts or megawatts.

The operating potentials for the electrodes of the Klystron are provided by a suitable source of direct current generically exemplified by battery 17 and the relation between the various potentials may be adjusted to desired operating values as by the potentiometers 18—19 of a potential-dividing circuit in shunt to the source 17.

The low-power oscillator 10 is connected or coupled to a mixer 20 by a transmission line 21 which may be a waveguide or coaxial line. The mixer 20 may be of any of the types used in the microwave art and its rectifier is preferably of the solid or crystal type utilizing germanian, silicon or like asymmetric conductor.

A second input circuit of the mixer 20 is connected or coupled to a beat oscillator 22 as by a transmission line 23, of the waveguide or concentric line type, so to produce a relatively low beat frequency equal to the difference of the frequencies produced by oscillators 10 and 22. This beat frequency ($F_S-F_B$) is impressed, as by line 24, upon one input circuit of a phase detector 25 of any suitable known type including those shown in my copending applications Serial Nos. 35,185 filed June 25, 1948, and 49,934 filed September 18, 1948.

The oscillator 26 is a high-power microwave oscillator suited to deliver microwave energy at high level to an antenna or other load, generically represented by the block 27, coupled thereto by a transmission line 28 of the waveguide or coaxial line type. A minute fraction of the output of the high power oscillator 26 is impressed, as by line 29, upon a second mixer 30 similar to mixer 20 and upon which is also impressed, as by line 31, microwave oscillations of the frequency $F_B$. Preferably, the same beat frequency oscillator 22 is utilized for both mixers to avoid the phase-stabilizing difficulties arising due to differential phase or frequency differences should two beat-frequency oscillators be used. The use of a common source of beat frequency $F_B$ also insures cancellation of any noise or hum in the outputs of the two mixers. The output frequency ($F_O-F_B$) of mixer 30 is impressed, as by line 32, upon a second input circuit of the phase detector 25 so to produce, jointly with the output of mixer 20, a direct-current output voltage which varies in sense and magnitude with change in the phase relation of the low frequencies ($F_S-F_B$ and $F_O-F_B$) impressed upon the respective input circuits of the phase comparator or detector 25.

The direct-current output voltage of phase detector 25 is applied, as by line 33, to control the frequency of the high power oscillator 26 closely to maintain a fixed phase relation between the two beat frequencies. The manner in which the output voltage of the phase comparator is applied to control the frequency of oscillator 26 depends upon the particular type of oscillator. In Figs. 2 and 3 there are shown two modes of applying the voltage to specific forms of high power oscillators.

The stabilizing system shown and described may be designated as a two-channel servo-system: the channel including mixer 20 provides standard-frequency information to phase-comparator 25 common to the two channels and the channel including mixer 30 provides the frequency-error information. The output voltage of the comparator is the negative feed-back voltage of the servo-system which effects stabilization of the frequency of the high-power oscillator 26 at the standard frequency produced by the low-power oscillator 10.

To effect frequency-modulation of the high power energy supplied to the load 27 for transmission of audio or video signals, for example, the frequency of either oscillator, preferably oscillator 26, is varied by a modulating signal in any known electrical or mechanical manners. A modulator for the high-power oscillator 26 is generically represented by the block 34; specific arrangements for effecting frequency-modulation of the gas controlled oscillator 10 are later discussed.

When either oscillator is to be modulated, the frequency of the beat oscillator 22 should preferably be so chosen that the beat frequencies ($F_O-F_B$ and $F_S-F_B$) are substantially outside the range of modulation frequencies.

The beat frequency should be at least several megacycles in order that the time constants of integrating circuits associated with or incorporated in the phase detector 25 may be small so to insure that only slight phase deviation of the outputs of the mixers 20 and 30 is necessary to effect appreciable change in the output voltage of the phase comparator 25.

In the specific arrangement shown in Figure 2, the phase comparator 25A is a bridge network including pairs of oppositely poled rectifiers 35—35. One beat frequency ($F_S-F_B$) is impressed, as by transformer 36, upon the input terminals 37A—37B of the bridge and the other beat frequency ($F_O-F_B$) is impressed, as by a similar tuned beat-frequency transformer 38, upon another crossarm between the bridge terminals 39A—39B.

In the particular arrangement shown in Figure 2, the direct-current output voltage of the phase-comparator is impressed upon the control grid of a regulator tube 40 in circuit with the power supply 41 for the anode of a high-power magnetron 26A. The tube 40 may be connected as a shunt regulator tube, as shown in Figure 2, or may be connected as a series-regulator tube in manner per se known in the art. In either event, the anode voltage of the magnetron is automatically varied under control of the phase-comparator 25A, or equivalent, closely to maintain a fixed phase relation between the two beat frequencies $F_S-F_B$ and $F_O-F_B$. The variable resistor 42 in circuit with the regulator tube 40 may be provided for adjustment of the anode voltage of the magnetron in rough approximation of its desired operating frequency. Variation of the potential of the control grid of the regulator tube 40 at the beat-frequency is to be avoided and may be prevented by interposition of a suitable filter 43 between the regulator tube and the phase comparator.

To effect frequency-modulation of the high-power magnetron 26A, the modulating signal may be impressed, as shown, by a loop or probe into a cavity of the magnetron so to vary the microwave field. Alternatively, the modulating signal may be applied to change the direct current difference of potential between the anode and cathode of the magnetron: specifically, the modulating potential may be injected, as shown, in the cathode circuit of the regulator tube 40 as by a modulation transformer 34A.

When the magnetron is of a type having a control grid 45, for an auxiliary modulating electron beam projected through one of the anode cavity resonators, as shown in Figure 3, the frequency-control voltage derived by the phase comparator from the two beat frequencies may be impressed upon this control grid so to maintain the high-power oscillator in synchronism with the low power frequency-stabilized oscillator 10.

As indicated, it is also possible to modulate the control oscillator 10. One method of accomplishing this result is shown in Figure 4 where a Stark electrode S is introduced into the gas chamber 14. If the Stark electric field has a D. C. component, $E_{DC}$, and an A. C. component, $E_{AC}$; then if $E_{DC}>E_{AC}$, the frequency shift of the gas absorption line used for stabilization will be proportional to $E_{AC}$, the modulating voltage.

It is also possible to effect modulation by introducing phase shift proportional to a desired modulating voltage in Figure 1 in line 24 connecting mixer 20 and phase detector 25, or phase shift in line 32 connecting mixer 30 and phase detector 25, or differential phase shifts in the two channels. Such phase shifts may be introduced, for example, by reactance tube circuits 34*b*, 34*c* responsive to the modulation signals.

It shall be understood the invention is not limited to the particular types of phase comparators and high power oscillators specifically shown and that changes and modifications may be made within the scope of the appended claims.

What is claimed is:

1. The method of producing microwave oscillations at high level and of rigidly stabilized frequency which comprises stabilizing the frequency of a low-power microwave oscillator at the desired operating frequency of a high-power microwave oscillator, beating the output frequencies of said oscillators against a third microwave frequency respectively to produce two low-frequency potentials, and varying a frequency-control means of the high power oscillator closely to maintain a fixed phase relation between said two low-frequency potentials.

2. The method of producing microwave oscillations of rigidly stabilized frequency at high power level which comprises generating microwave energy at low level by a lightly-loaded low-power oscillator, stabilizing the frequency of said low-power oscillator by a high-Q element exhibiting sharp resonance at the desired operating frequency of a high-power heavily-loaded oscillator, beating the output frequencies of said oscillators against a third microwave frequency respectively to produce two low-frequency potentials, and varying a frequency control means of the high-power oscillator in accordance with variation of the phase relation between said two low-frequency potentials to minimize deviation of the frequency of the high power oscillator.

3. The method of stabilizing the frequency of a high-power oscillator system including a tube having an electrode whose potential affects the output frequency of said system which comprises generating microwave energy at low level by a lightly-loaded low-power oscillator, stabilizing the frequency of said low-power oscillator by a high Q element exhibiting sharp resonance at the desired operating frequency of said high-power oscillator, beating the output frequencies of said low power oscillator and said high power oscillator system against a third microwave frequency to produce two low-frequency potentials, deriving from said low-frequency potentials a direct-current voltage varying in sense and magnitude with the phase difference of said low-frequency potentials, and applying said direct-current voltage to said electrode of the high-power oscillator system.

4. The method of producing miscrowave oscillations of rigidly stabilized frequency at high power level which comprises generating microwave energy at low level by a lightly-loaded low-power microwave oscillator, stabilizing the frequency of said low-power oscillator at the molecular resonance frequency of a gas at low pressure, beating the output frequencies of said low-power oscillator and of a high-power microwave oscillator against a third microwave frequency respectively to produce two low-frequency potentials, and varying a frequency control means of the high-power oscillator closely to maintain a fixed phase relation of said two low-frequency potentials.

5. The method of stabilizing the frequency of a high-power oscillator system including a tube having an electrode whose potential affects the output frequency of said system, which comprises generating microwave energy at low level by a lightly-loaded low-power oscillator, controlling the feedback of said oscillator by a confined body of gas exhibiting molecular resonance at the desired operating frequency of said high-power oscillator, beating a third microwave frequency against the stabilized frequency of said low-power oscillator and against the frequency of said high-power oscillator respectively to produce two low-frequency potentials, continuously comparing the phase relation between said low-frequency potentials, and varying a frequency control means of the high-power oscillator closely to maintain a fixed phase relation of said low-frequency potentials.

6. A system for producing microwave energy of rigidly stabilized frequency at high power level comprising a high-power microwave oscillator system including a tube having an electrode whose potential affects the output frequency of said system, a lower power multi-cavity microwave generator, a feedback loop between cavities of said generator including a high Q element exhibiting resonance at the desired operating frequency of said high-power microwave oscillator system, mixers upon which the outputs of said oscillators are respectively impressed, means for producing a beat frequency also impressed upon said mixers to produce two low-frequency potentials respectively containing standard-frequency information and frequency-error information, a phase comparator having input circuits upon which the outputs of said mixers are impressed to produce a direct-current voltage varying in sense and magnitude with variation of the phase relation between said low-frequency potentials, and means for applying said direct-current voltage to said electrode in sense corrective of frequency deviations of said high-power oscillator.

7. A system for producing microwave energy of rigidly stabilized frequency at high-power levels comprising a high-power microwave oscillator system including a tube having an electrode whose potential affects the output frequency of said system, a low-power multi-cavity microwave generator, a feedback loop between cavities of said microwave generator including a confined body of gas exhibiting molecular resonance at the desired operating frequency of said high-power oscillator system, a pair of mixers upon which the output frequencies of said oscillators are impressed, a microwave generator producing oscillations impressed upon both of said mixers to produce low-frequency potentials respectively containing standard-frequency information and frequency-error information, a phase-comparator having input circuits upon which said low-frequency potentials are impressed to produce a direct-current voltage varying in sense and magnitude with variations of the phase relation between said low-frequency potentials, and means for applying said direct-current voltage to said electrode in sense corrective of frequency deviations of said high-power oscillator.

8. A two-channel servo-system for stabilizing the frequency of a high-power microwave generator comprising a low-power frequency-stabilized microwave generator, mixers respectively included in said channels for impression upon one of them of the output frequency of said high-power generator and upon the other of them of the output frequency of said low-power generator, a third generator impressing microwave energy upon both of said mixers to produce beat-frequency potentials, a phase-comparator common to said channels for producing a direct-current voltage varying in sense and magnitude with variations of the phase relation of said beat-frequency potentials, and circuit means for applying said direct-current voltage in correction of the frequency deviations of said high-power oscillator.

9. A system as in claim 8 in which the high-power oscillator is frequency-modulated for transmission of audio or video signals and in which the frequency of the third microwave generator is chosen to produce beat-frequency potentials substantially beyond the frequency range of the modulating signals.

10. A system as in claim 9 wherein said high-power oscillator comprises a magnetron having a modulating electron beam system therein, and means for controlling said beam in accordance with signal intelligence.

11. A system as in claim 8 including means for phase modulating the signals in one of said channels in accordance with signal intelligence.

12. A system as in claim 8 including means for differentially phase modulating the signals in both of said channels in accordance with signal intelligence.

LOWELL E. NORTON.

REFERENCES CITED

The following references are of record in the file of this patent:

UNITED STATES PATENTS

| Number | Name | Date |
|---|---|---|
| 2,341,649 | Peterson | Feb. 15, 1944 |
| 2,462,294 | Thompson | Feb. 22, 1949 |